(12) United States Patent
Suzuki et al.

(10) Patent No.: US 6,380,025 B1
(45) Date of Patent: Apr. 30, 2002

(54) METHOD OF ENCAPSULATING A PHOTOVOLTAIC MODULE BY AN ENCAPSULATING MATERIAL AND THE PHOTOVOLTAIC MODULE

(75) Inventors: Takayuki Suzuki, Shiga; Hideo Yamagishi, Kyoto; Masataka Kondo, Kobe, all of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/528,724

(22) Filed: Mar. 20, 2000

(30) Foreign Application Priority Data

| Jun. 8, 1999 | (JP) | ............................................. 11-160786 |
| Jun. 8, 1999 | (JP) | ............................................. 11-160787 |
| Aug. 16, 1999 | (JP) | ............................................ 11-229828 |
| Aug. 16, 1999 | (JP) | ............................................ 11-229829 |

(51) Int. Cl.$^7$ .......................................... H01L 21/8234
(52) U.S. Cl. ...................... 438/238; 438/156; 156/192; 156/301; 156/302; 136/245; 136/251
(58) Field of Search .............................. 438/238, 156; 156/301, 192, 302; 136/245, 251

(56) References Cited

U.S. PATENT DOCUMENTS

| 5,098,498 A | * | 3/1992 | Hale et al. .................... 156/213 |
| 5,273,608 A | * | 12/1993 | Nath ............................ 156/301 |
| 5,712,199 A | * | 1/1998 | Nakagawa et al. ............ 438/62 |
| 5,733,382 A | * | 3/1998 | Hanoka ........................ 136/251 |
| 6,093,757 A | * | 7/2000 | Pern ............................. 524/99 |

FOREIGN PATENT DOCUMENTS

JP          10-095089          4/1998

* cited by examiner

Primary Examiner—Richard Elms
Assistant Examiner—Pho Luu
(74) Attorney, Agent, or Firm—Hogan & Hartson, L.L.P.

(57) ABSTRACT

In the present invention, a diaphragm for pressurizing and heating an encapsulating material is pre-heated to a predetermined temperature before laminating a lamination unit comprising a photovoltaic module and the encapsulating material. As a result, one surface of the lamination unit is heated by a heater provided on a table and the other surface is heated by the diaphragm, so it is possible to prevent appearance of a temperature difference between the surfaces.

6 Claims, 5 Drawing Sheets

METHOD OF ENCAPSULATING A PHOTOVOLTAIC MODULE BY AN ENCAPSULATING MATERIAL AND THE PHOTOVOLTAIC MODULE

CROSS-REFERENCE TO RELATED APPLICATIONS

This application is based upon and claims the benefit of priority from the prior Japanese Patent Applications No. 11-160786, filed Jun. 8, 1999; No. 11-160787, filed Jun. 8, 1999; No. 11-229828, filed Aug. 16, 1999; and No. 11-229829, filed Aug. 16, 1999, the entire contents of which are incorporated herein by reference.

BACKGROUND OF THE INVENTION

The present invention relates to a method of manufacturing a photovoltaic module in which an encapsulating material encapsulates a semiconductor cell provided on a glass substrate.

There is a non-single-crystal type photovoltaic module in addition to a crystal type photovoltaic module which uses single crystaline silicon or polycrystal silicon. In either type, silicon tends to encourage chemical reactions and is weak against physical impacts.

Hence, a structure in which the semiconductor cell formed in the photovoltaic module is laminated with an encapsulating material containing, as a main component, ethylene vinyl acetate copolymer (hereinafter abbreviated as EVA) or ethylene vinyl acetate triallyl isocyannulate ternary copolymer bridge material (hereinafter EVAT) has been adopted for the purpose of protecting silicon or the like.

Japanese Patent Application KOKAI Publication No. 10-95089 discloses a conventional apparatus in which a photovoltaic module is laminated with an encapsulating material such as EVA or EVAT.

In general, in this kind of apparatus, an upper chamber including a diaphragm and a lower chamber including a heater table are arranged so as to be opened and closed relative to one another. The heater table and the diaphragm pressurize and heat the photovoltaic module and the encapsulating material so as to integrate them together.

At this time, the substrate of the photovoltaic module is directly heated on one side surface thereof while the encapsulating material provided on the other side surface is heated indirectly by heat transfer from the heater table through the substrate. Therefore, a temperature difference appears between both surfaces of the substrate in the heating process, so the substrate is easily warped due to the temperature difference. Consequently, end portions of the substrate are damaged during pressurization or the entire substrate is not heated uniformly in some cases.

Therefore, conventionally, a lamination unit to be laminated, comprising a photovoltaic module and an encapsulating material, are pre-heated by a pre-heater and then conveyed into the chamber.

If the lamination unit is thus pre-heated, the temperature difference between the substrate and the encapsulating material can be smaller compared with the case of no pre-heating.

After pre-heating by the pre-heater, the lamination unit to be laminated is heated by the heater table and the diaphragm provided in the upper chamber is elastically deformed to make the diaphragm contact the lamination unit. Pressurizing and heating are thus performed.

However, the temperature of the diaphragm is normally very low compared with the heater table. If the diaphragm is deformed to contact the lamination unit to be laminated, this diaphragm absorbs the heat of the lamination unit.

Thus, the lamination unit to be laminated has a relatively large temperature difference between the surface on the side contacting the heater table and the other surface on the side contacting the diaphragm. As a result, the substrate becomes warped due to the temperature difference between the surfaces of the lamination unit. If the warped substrate is pressurized and heated, the substrate is damaged or the temperature of the lamination unit becomes uneven. In particular, the uneven temperature makes the thermal contraction of the encapsulating material uneven thereby causing wrinkles.

Meanwhile, the encapsulating material is formed like a sheet by extrusion molding and is wound up by a wind roller after the molding. This material is cut into a predetermined size when it is used.

Because the encapsulating material is thus subjected to extrusion molding and wound up on a wind roller, a residual stress unavoidably stays in the encapsulating material. Therefore, if the part to be laminated which comprises a photovoltaic module and an encapsulating material layered during the laminating process, the encapsulating material contracts due to the residual stress in some cases.

As a result, wirings of the semiconductor are misaligned or the encapsulating material is wrinkled so defective products are created due to deteriorated outer appearance.

BRIEF SUMMARY OF THE INVENTION

The present invention hence has an object of providing a method of encapsulating a photovoltaic module, which is capable of uniformly heating and thereby laminating a lamination unit comprising the photovoltaic module and an encapsulating material.

Another object of the present invention is to provide a photovoltaic module and a method of encapsulating the same in which contraction is not caused when pressurizing and heating a lamination unit comprising a photovoltaic module and an encapsulating material to laminate the lamination unit.

To achieve the above objects, according to the present invention, there is provided a method of encapsulating a photovoltaic module utilizing a lower chamber containing a table having a heater, and an upper chamber having a diaphragm elastically deformable under a pressure, the upper chamber and the lower chamber arranged to open and close relative to one another. The method is designed to laminate a lamination unit having an encapsulating material and the photovoltaic module. The method comprises the steps of: pre-heating the diaphragm to a predetermined temperature; supplying the lamination unit onto the table; and pressing and heating the lamination unit by elastically deforming the diaphragm.

According to the method of encapsulating a photovoltaic module as described above, the lamination unit is heated such that one surface of the lamination unit which contacts a table and the other surface which contacts the diaphragm are heated to substantially equal temperatures. Accordingly, a temperature difference is difficult to occur.

The other objects and advantages of the present invention will be understood from the following description or embodiments of the present invention. Various objects of the present invention will be achieved by the structures clearly defined in the appended claims and combinations thereof.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the following, an embodiment of the present invention will be explained with reference to the drawings.

Figure 7:
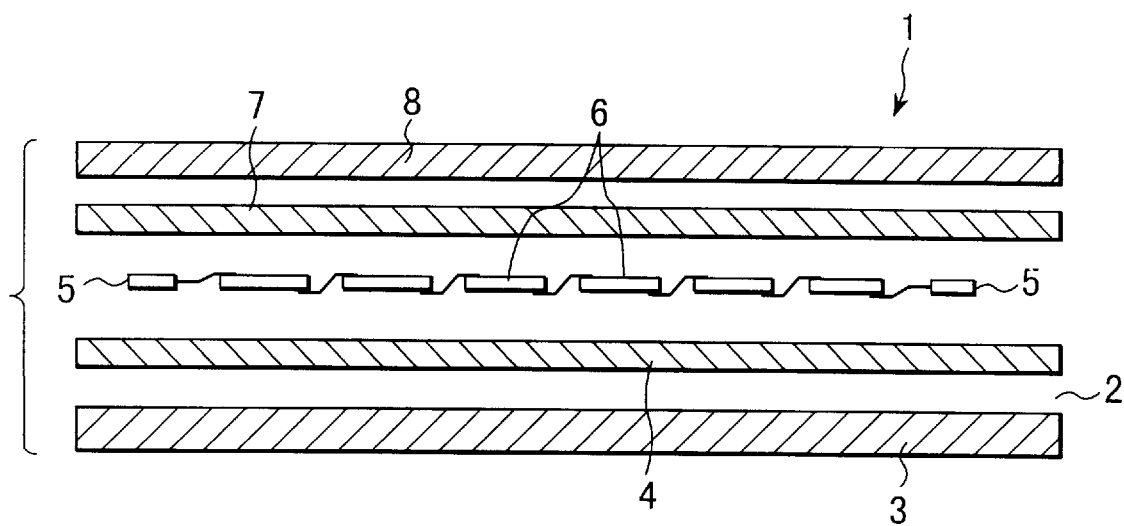
FIG. 7 is illustration showing a schematic structure of the lamination unit.

A lamination unit 1 to be laminated according to this embodiment has a glass substrate 3 forming part of a photovoltaic module 2 of single crystaline type as shown in FIG. 7. A sheet-like first encapsulating material 4 made of material such as EVA or EVAT, a plurality of semiconductor cells 6 connected through an inner lead line and having electrodes 5 at both ends, a sheet-like second encapsulating material 7 also made of material such as EVA or EVAT, and a sheet-like back-surface protect material 8 are layered sequentially on the substrate 3. The back-surface protect material 8 has a three-layer structure in which fluororesin is adhered on both surfaces of aluminum foil, for example.

The lamination unit 1 to be laminated is laminated integrally by an encapsulating device 11 shown in FIGS. 1 to 6. This encapsulating device 11 has a lower chamber 12 and an upper chamber 13 which is driven to open and close with respect to the lower chamber 12 by a drive mechanism 10.

A table 14 which is supplied for the lamination unit 1 is provided in the lower chamber 12. A heater 15 is included in this table 14 so the lamination unit 1 supplied on this table can be heated. In the present embodiment, the lamination unit 1 is supplied such that the substrate 3 is situated in the lower side and is mounted on the table 14. Further, a lower suction hole 17 is formed in one side wall of the lower chamber 12, and a lower suction pump 16 is piped and connected to the lower suction hole 17.

The upper chamber 13 is provided with a diaphragm 21 airtightly fixed to the inner circumferential wall of the chamber 13 throughout the total length of the peripheral portion. The diaphragm 21 has a heat resistance and is formed of an elastic material such as rubber which can be expanded and contracted elastically.

An upper suction hole 22 which communicates with a space 20 separated by the diaphragm 21 is formed in one side wall of the upper chamber 13. An upper suction pump 23 is piped and connected to the upper suction hole 22.

Figure 1:
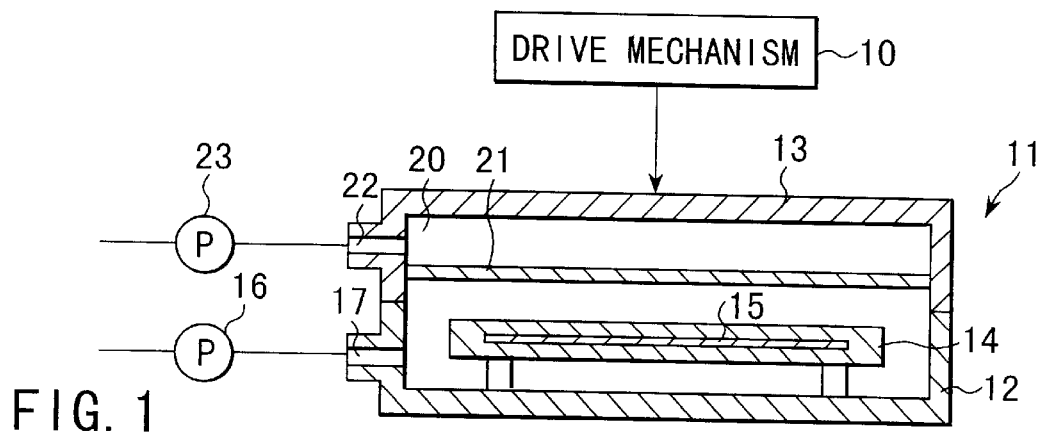
FIG. 1 is an illustration showing the first embodiment of the present invention where a vacuum lamination apparatus device is closed.
Figure 2:
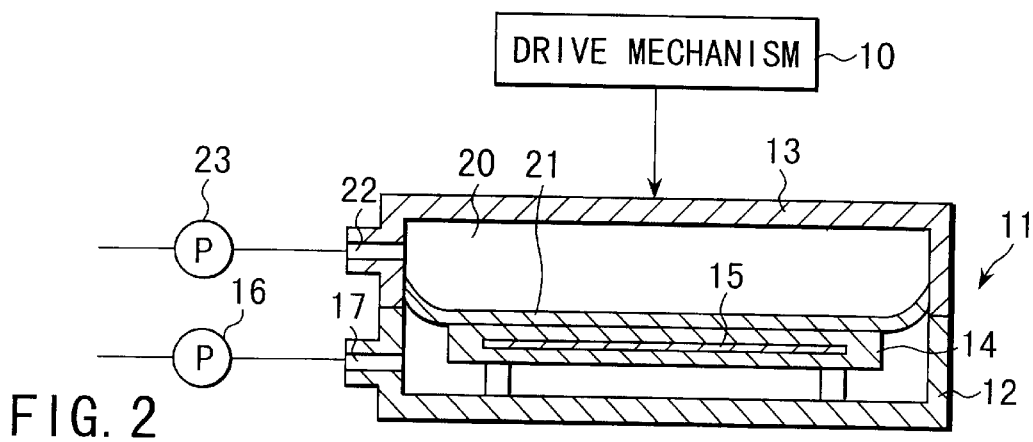
FIG. 2 is an illustration showing the first embodiment where a lower chamber is depressurized to pre-heat a diaphragm.

To laminate the lamination unit 1 by the encapsulating device 11, i.e., to encapsulate the semiconductor cells 6, the upper chamber 13 is firstly closed with respect to the lower chamber 12 as shown in FIG. 1. Then, the heater 15 provided on the table 14 is rendered electrically conductive and the inside of the lower chamber 12 is depressurized by operating the lower suction pump 16.

By thus depressurizing the inside of the lower chamber 12, the diaphragm 21 is elastically deformed and expanded into the lower chamber 12 having a low pressure to make contact with the upper surface of the table 14. Since this table 14 is heated by the heater 15, the diaphragm 21 contacting the upper surface of the table is also heated.

The diaphragm 21 is heated to a temperature substantially equal to the temperature at which the lamination unit 1 is laminated. That is, the temperature for laminating the lamination unit 1 is the temperature at which cross-linking reaction occurs throughout the entire area as the encapsulating materials 4 and 7 are heated and at which the encapsulating materials 4 and 7 are thermally decomposed but no foaming takes place due to a decomposed gas therefrom, e.g., 150° C. or so. The diaphragm 21 is thus heated to about 150° C. by the table 14.

Figure 8:
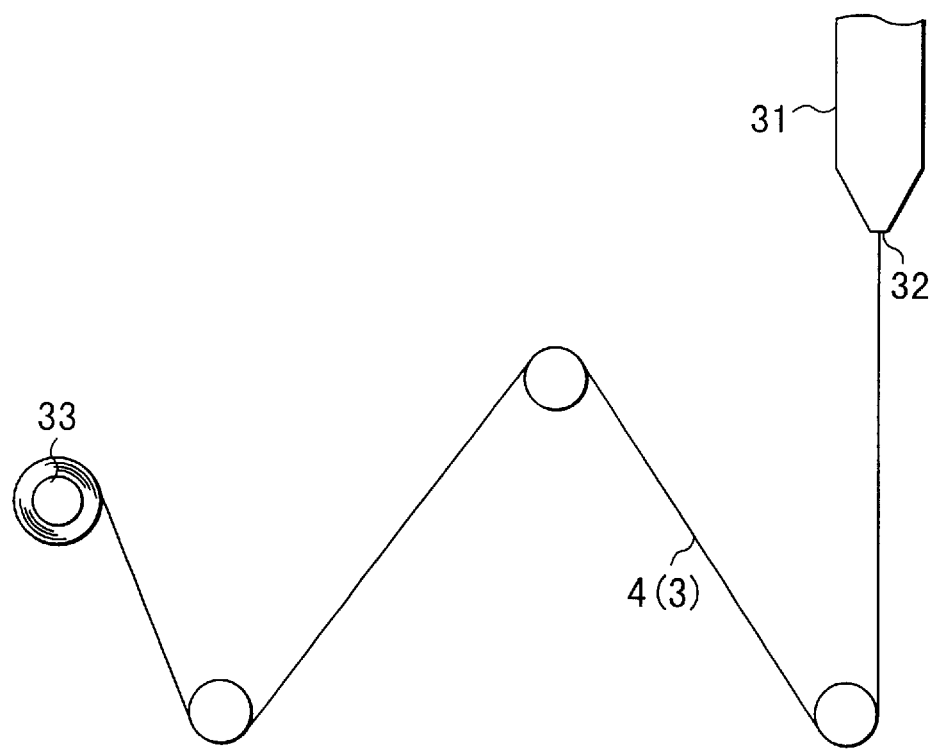
FIG. 8 is an illustration showing a shaping method of the encapsulating material.

The encapsulating materials 4 and 7 used for the lamination unit 1 are extruded from a nozzle 32 of an extruder 31 as shown in FIG. 8 and shaped into a sheet-like form, and are wound around a wind roller 33. Therefore, stresses applied during the shaping and winding remain in the encapsulating materials, so these materials cause contraction when pressing and heating are carried out during lamination.

Hence, the encapsulating materials 4 and 7 are subjected to a heat treatment before these materials are shaped and processed. The heat treatment is carried out under conditions where the temperature is 40 to 60° C. and the duration time is 6 to 12 hours.

If the temperature of the heat treatment is 40° C. or less, the residual stress cannot be eliminated sufficiently and contraction occurs when heated during lamination. Since the encapsulating materials 4 and 7 made of EVA or EVAT melt at 70° C., the temperature should preferably be set to 60° C. or less in order that the shape is not deformed. It has also been confirmed through experiments that the time required for the heat treatment, i.e., the time in which the residual stress is eliminated is 6 to 12 hours.

By making this heat treatment, internal stresses in the encapsulating materials 4 and 7 are eliminated simultaneously as the encapsulating materials contract softly and excessive compounded materials are removed. Therefore, if these materials are heated to 150° C. in the lamination process described later, deformation hardly occurs.

Figure 3:
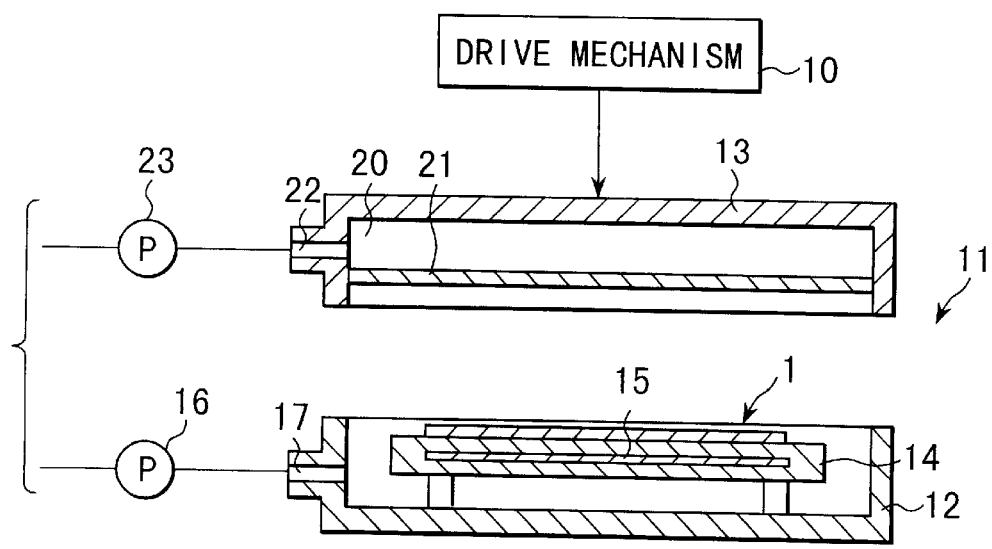
FIG. 3 is an illustration showing the first embodiment where a lamination unit is supplied on a mount disk.

After the diaphragm 21 is heated, the lower chamber 12 is released from a depressurized state and the upper chamber 13 is then moved up, as shown in FIG. 3. Thus the lamination unit 1 is supplied onto the table 14 of the lower chamber 12.

Figure 4:
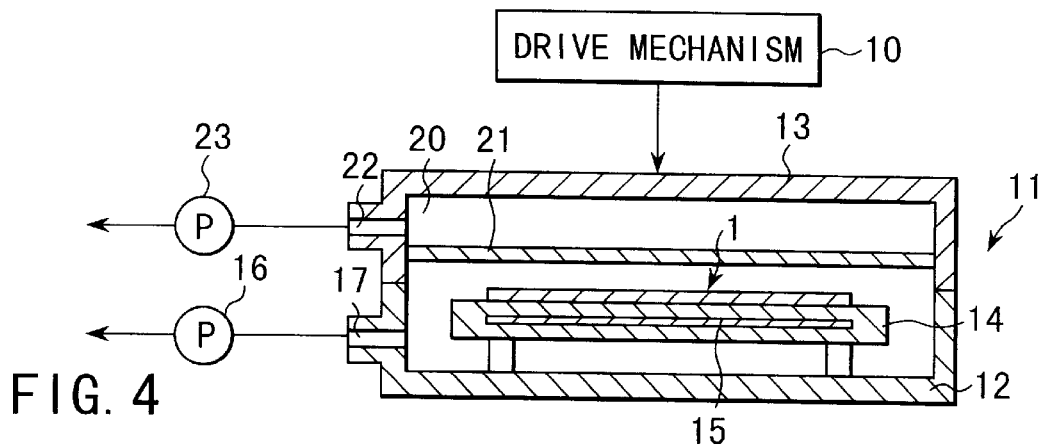
FIG. 4 is an illustration showing the first embodiment where lower and upper chambers are depressurized to degas EVA.

Subsequently, the upper chamber 13 is closed relative to the lower chamber 12 and the lower chamber 12 is depressurized as shown in FIG. 4 thereby removing gases contained in the encapsulating materials 4 and 7. At this time, the space 20 in the upper chamber 13 is also depressurized like in the lower chamber 12 so as to prevent the expansion or deformation of the diaphragm 21 in the direction towards the lower chamber 12.

Figure 5:
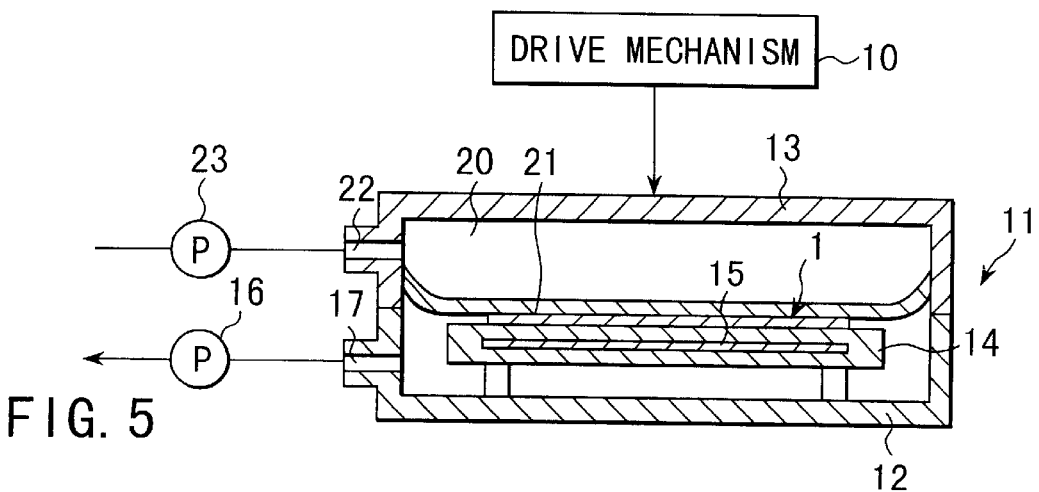
FIG. 5 is an illustration showing the first embodiment where the upper chamber is released from the depressurized state thereby elastically deforming the diaphragm downward.
Figure 6:
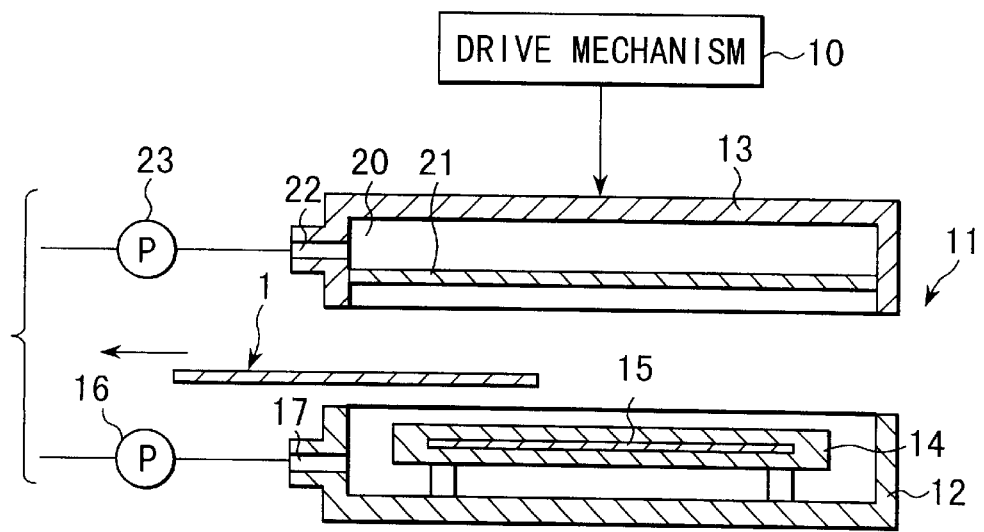
FIG. 6 is an illustration showing the first embodiment where the encapsulating device is opened to pick out the lamination unit from the table.

Next, the space 20 in the upper chamber 13 is released from a depressurized state as shown in FIG. 5. As a result, the diaphragm 21 provided in the upper chamber 13 expands and deforms downward so as to be pressed into contact with the lamination unit 1 mounted on the table 14. Therefore, the lamination unit 1 is pressed and heated by the table 14 and the diaphragm 21 and is thus integrated, i.e., laminated. This lamination process is carried out at a temperature of 150° C. for a time of about 10 minutes.

When laminating the lamination unit 1, the lamination unit is heated from both the upper and lower sides by the table 14 provided with the heater 15 and the pre-heated diaphragm 21.

Therefore, there is no substantial temperature difference between the upper and lower surfaces in the thickness direction. Accordingly, it is possible to eliminate drawbacks such as the substrate 3 being warped due to the temperature difference between the upper and lower surfaces, and damage resulting from an uneven temperature distribution that prevents the encapsulating materials 4 and 7 from sufficiently generating a cross-linking reaction.

The first and second encapsulating materials 4 and 7 thus used are subjected to heat treatment. Therefore, the first and second materials 4 and 7 are scarcely deformed by residual stress even if these materials are heated to 150° C. during lamination. It is hence possible to prevent wrinkling and misalignment of wires of the semiconductor cells 6.

Prior to lamination of the semiconductor cells 6 by the encapsulating materials 4 and 7, the inside of the lower chamber 12 is depressurized to degas the encapsulating materials 4 and 7, and thus, bubbles are prevented from remaining in the encapsulating materials 4 and 7. Therefore, holes due to bubbles are not formed in the encapsulating materials 4 and 7, so the encapsulating of the semiconductor cells 6 is ensured.

After the lamination unit 1 is thus laminated, the lower chamber 12 is released from the depressurized state and the diaphragm 21 deformed and expanded downward is contracted to its original state. Thereafter, the upper chamber 13 is moved up to open the encapsulating device 11, and the lamination unit 1 is picked off from the table 14. A new lamination unit 1 is laminated by repeating the steps described above.

Although the upper chamber 13 is driven open and closed with respect to the lower chamber 12 in the first embodiment, the lower chamber 12 may be driven open and closed, or both chambers may be moved up and down, i.e., opened and closed. In brief, it suffices that the upper chamber 13 can be opened and closed relative to the lower chamber 12.

A photovoltaic module of crystal type has been exemplified as a lamination unit. The present invention is, of course, applicable to a photovoltaic module of amorphous silicon type using non-single-crystal silicon.

In the following, a photovoltaic module of amorphous silicon type will be explained as a second embodiment of the present invention with reference to FIGS. 9 to 13.

Figure 9:
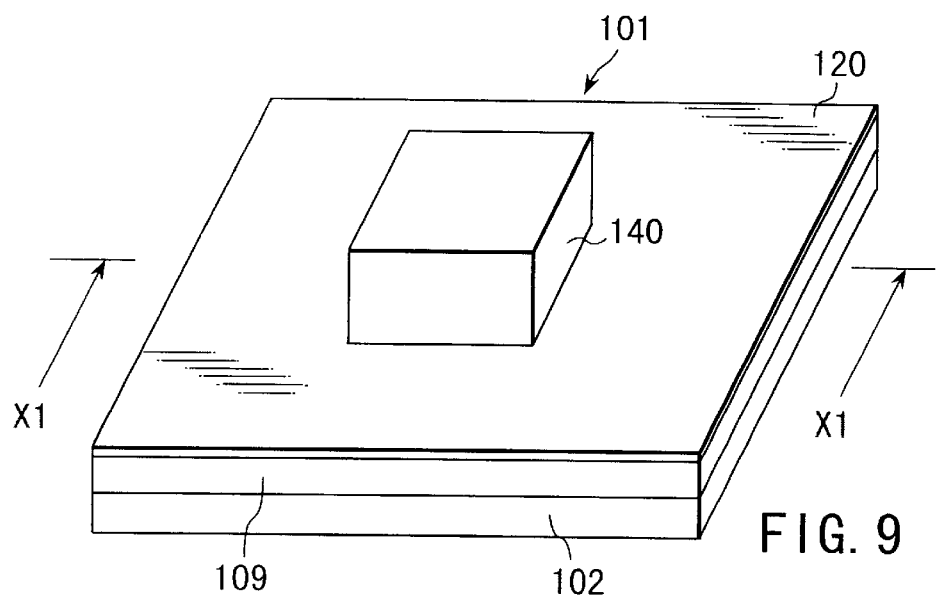
FIG. 9 is a perspective view of a photovoltaic module according to the second embodiment of the present invention viewed from the back side.
Figure 10:
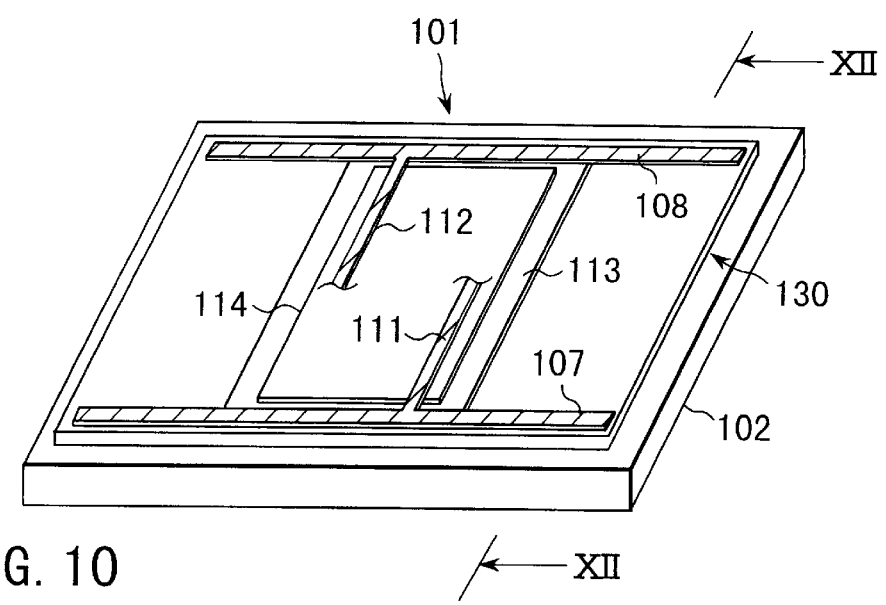
FIG. 10 is a perspective view of a photovoltaic module according to the second embodiment where a back-surface protect material and an encapsulating material are removed from the photovoltaic module.
Figure 11:
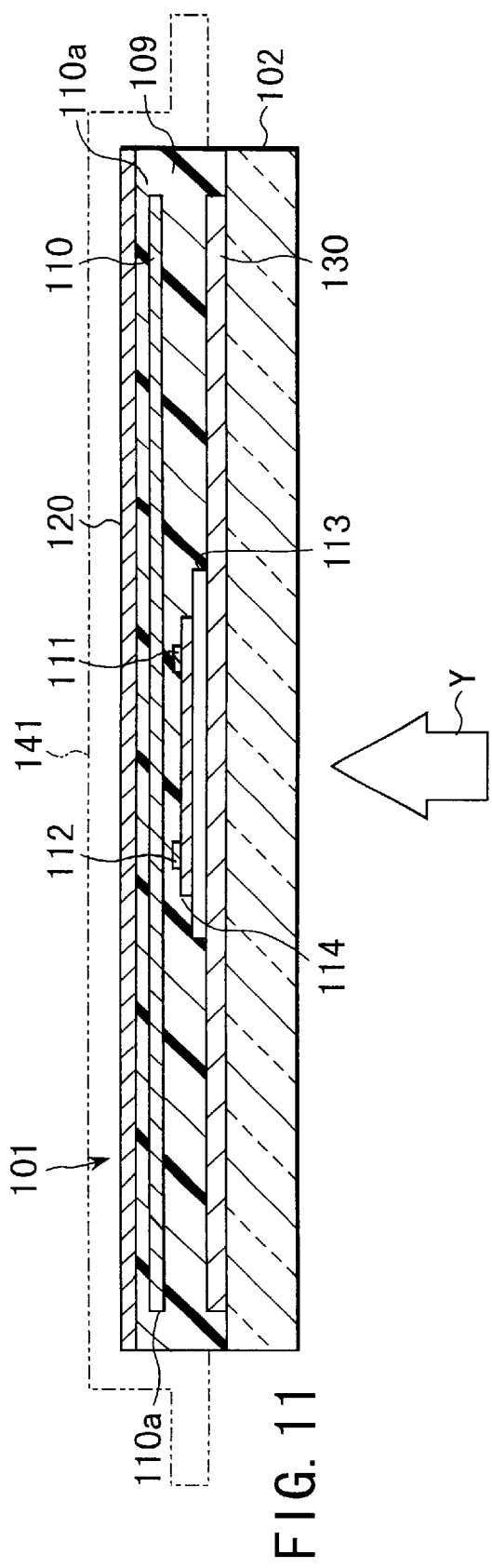
FIG. 11 is a cross-sectional view according to the second embodiment cut along the line XI—XI in FIG. 9.
Figure 12:
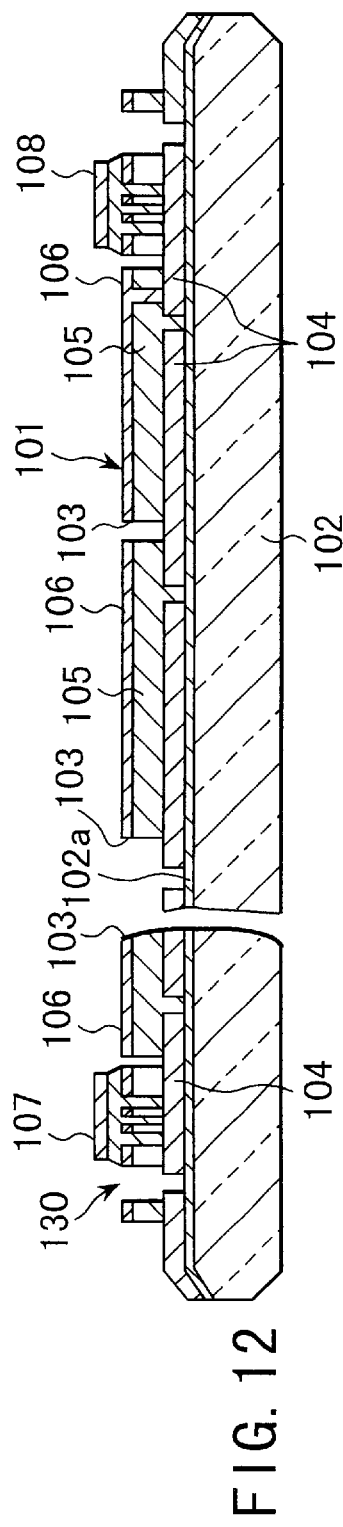
FIG. 12 is a cross-sectional view according to the second embodiment cut along the line XII—XII in FIG. 9.

FIG. 9 is a perspective view of a photovoltaic module 101 of according to the second embodiment viewed from the back side. FIG. 10 is a perspective view showing a state where a back-surface encapsulating material and filler which will be described later are removed from the photovoltaic module 101 shown in FIG. 9. FIG. 11 is a cross-sectional view of the photovoltaic module 101 cut along the line XI—XI shown in FIG. 9. FIG. 12 is a cross-sectional view showing the photovoltaic module 101 of FIG. 10 cut along the line XII—XII.

An output lead cable not shown is led from the a terminal box 140 shown in FIG. 9, which will be described later. A connection terminal for connection to another cable is attached to the other end of this output lead cable.

The photovoltaic module 101 has a transparent glass substrate 102 having a substantially rectangular plate-like shape for transmitting sun light, as shown in FIG. 12. On the back surface of this substrate 102, a plurality of semiconductor cells 103 each having a substantially rectangular shape are formed and arranged in parallel along a predetermined direction of the substrate 102 with an $SiO_2$ film 102a interposed therebetween. All the semiconductor cells 103 are electrically connected in series such that the output voltage is high and the output current is small in order to increase the power generation efficiency of the photovoltaic module 101.

Each semiconductor cell 103 includes, for example, a transparent electrode layer 104 provided on the $SiO_2$ film 102a on the back surface of the substrate 102, an amorphous semiconductor layer 105 deposited on this transparent electrode layer 104, and a back-surface electrode layer 106 provided on the amorphous semiconductor layer 105.

The semiconductor cells 103 which are adjacent to each other are electrically connected by connecting the back-surface electrode layer 106 of one element to another the transparent electrode layer 104 of the other element. In this manner, all the semiconductor cells are connected in series.

Further, a bus bar line 107 is provided at an end portion of the transparent electrode 104 of the semiconductor cell 103 in the left end in FIG. 12 while another bus bar 108 is provided at an end portion of the back-surface electrode layer 10 of the semiconductor cell 103 in the right end. Each of the bus bar lines 107 and 108 is arranged along the direction crosses the predetermined direction of the substrate 102 described previously.

Each of the bus bar lines 107 and 108 slightly projects from the semiconductor cells 103 to the back side as shown in FIG. 12. In the following explanation, a layer consisting of a plurality of semiconductor cells 103 provided in parallel on the back surface of the glass substrate 102 will be called a solar battery layer 130.

As shown in FIG. 10, the bus bar lines 107 and 108 led in the back-surface side of the solar battery layer 130 are respectively connected with output lead lines 111 and 112 extending toward the substantial center of the photovoltaic module 101. Ends of the output lead lines 111 and 112 penetrate through an encapsulating material 109, a non-woven fabric 110, and a back-surface protect material 120 which will be described later, and is connected to the terminal box 140 shown in FIG. 9.

As shown in FIGS. 10 and 11, an opaque insulating film 114 is provided between the solar battery layer 130 and the output lead lines 111 and 112, with sheet-like EVA 113 interposed in order to hide the output lead lines 111 and 112. The insulating film 114 is formed in a minimum size necessary and sufficient to cover the output lead lines 111 and 112.

By thus providing the insulating film 114 which covers the output lead lines 111 and 112 in the back-surface side of the solar battery layer 130, the output lead lines 111 and 112 are not observed from the front-surface side, i.e., from the direction in which sun light indicated with an arrow Y in FIG. 11, preferably in consideration of the outer appearance. If the insulating film 14 has the same color as the back-surface protect material 120, the insulating film 114 cannot be easily seen more preferably in view of the outer appearance from glass side.

The solar battery layer 130, bus bar lines 107 and 108, output lead lines 111 and 112, and insulating film 114 are encapsulate on the back surface of the substrate 102 by the encapsulating material 109 such as EVA or EVAT. This encapsulating material 109 is provided on the back surface of the glass substrate 102. An insulating protect material 110 described later is provided at an intermediate portion in the thickness direction of the encapsulating material 109.

By encapsulating the solar battery layer 130 with the encapsulating material 109, this encapsulating material 109 and the EVA 113 are melted and integrated.

The solar battery layer 130 is encapsulated by use of the encapsulating material 109, by means of the encapsulating device 11 as in the first embodiment.

Figure 13:
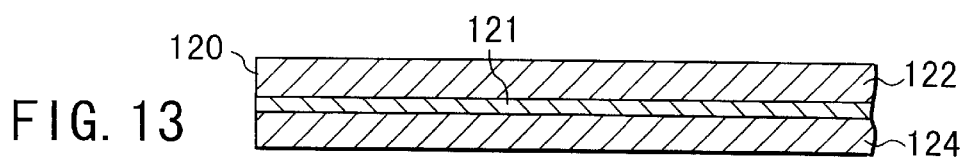
FIG. 13 is an enlarged cross-sectional view of a back-surface protect material according to the second embodiment.

A back-surface protect material 120 is provided in the back-surface side of the encapsulating material 109. This back-surface protect material 120 is comprised of a back-surface film 122 such as a fluororesin-based film or a PET film which has excellent moisture resistance and water resistance, and a non-woven fabric 124 as a shrinkproofing sheet which is adhered on the surface in the encapsulating material 109 side by an curing adhesion 121 in order to prevent contraction due to the heat of the back-surface film 122 as shown in FIG. 13.

Fibers such as glass fibers or polyester fibers having an electric insulating characteristic are used for the non-woven fabric 124. The curing adhesion 121 is selected from at least those materials that are not softened even when the back-surface protect material 120 is heated to the press-contact temperature of the encapsulating material 109 so that the adhesion might not softened thereby misaligning the back-surface film and the non-woven fabric 124 from each other when the back-surface protect material 120 is pressurized and heated.

By thus constructing a two-layer structure in which the non-woven fabric 124 is adhered as the back-surface protect material 120 for encapsulating the back surface of the photovoltaic module 101 on the back-surface film 122 such as fluororesin or the like, it is possible to prevent the back-surface film 122 from being contracted due to heat when the back-surface protect material 120 is heated and pressed into contact in the back-surface side of the module.

Figure 14:
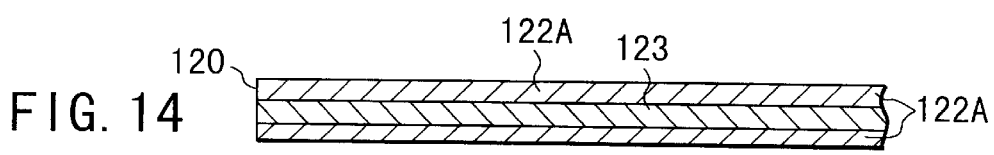
FIG. 14 is an enlarged cross-sectional view of a back-surface protect material according to another embodiment.

The back-surface protect material 120 may have a three-layer structure in which both surfaces of a metal foil 123 made of aluminum or the like are sandwiched by two resin films 122A such as fluororesin or the like as shown in FIG. 14. Use of a back-surface protect material 120 having this structure will be effective for protecting the semiconductor cells 103 from moisture because the metal foil 123 has a function to improve moisture resistance and water resistance.

To adhere the back-surface protect material 120 on the encapsulating material 109, the back-surface protect material 120 is previously adhered on the encapsulating material 109 when pressing and heating the encapsulating material 109 by means of the encapsulating device 11 as in the first embodiment.

In this manner, the back-surface protect material 120 is heated and pressed into contact with the encapsulating material 109. Since the back-surface protect material 120 is pressed into contact by using the diaphragm 21 of the encapsulating device 11, the back-surface protect material 120 can be securely pressed into contact even at convex portions, e.g., the bus bar lines 107 and 108 led in the back surface side of the photovoltaic module 130, the output lead lines 111 and 112, and the like.

In several cases, the back-surface protect material 120 is equipped with an iron attach plate 141, as indicated by a chain line in FIG. 11. This attach plate 141 is used to attach the photovoltaic module 101 to roofs or external walls of buildings.

The attach plate 141 is joined to the back-surface protect material 120 by an adhesion not shown and is then adhered and fixed by pressing this plate by a metal roller or the like.

At this time, the back-surface protect material 120 may be clamped and broken between the attach plate 141 and any convex portion of the bus bar lines 107 and 108 and the output lead lines 111 and 112. The bus bar lines 107 and 108 as well as the output lead lines 111 and 112 may then be electrically short-circuited to the attach plate 141.

Particularly in the case where the back-surface protect material 120 has a three-layer structure having a metal foil 123 such as aluminum foil inserted between two synthetic resin films 122A as shown in FIG. 14, the synthetic resin film 122A in the encapsulating material 109 side may be broken thereby exposing the bus bar lines 107 and 108 and the output lead lines 111 and 112 to contact with the metal foil 123 when the attach plate 141 is pressed into contact. In this case, leakage may be caused since the peripheral edge portion of the metal foil 123 is exposed to the outside.

However, as shown in FIG. 11, an insulating protect material 110 made of an electrically insulating material such as a non-woven fabric which covers the bus bar lines 107 and 108 and the output lead lines 111 and 112 is provided in the encapsulating material 109 which encapsulates the photovoltaic module 130.

Therefore, not only is breakage of the back-surface protect material 120 restricted, but also the bus bar lines 107 and 108 and the output lead lines 111 and 112 are prevented from being short-circuited to the attach plate 141 and the metal foil 123 used for the back-surface protect material 120.

The insulating protect material 110 needs only to have a shape which covers at least the bus bar lines 107 and 108 and the output lead lines 111 and 112. In the present embodiment, the insulating protect material 110 is provided substantially along the entire surface of the back-surface protect material 120 and is set in such a size with which all the end portions 110a thereof are not exposed to the outside.

As a result, if the contact between the encapsulating material 109 and the insulating protect material 110 is not sufficiently tight, water is prevented from entering into the encapsulating material 109 through the end portions of the insulating protect material 110.

The insulating protect material 110 uses fibers having an electrically insulating characteristic, such as glass fibers and polyester fibers, which are processed into a non-woven fabric. Among those fibers, polyester fibers are preferable. A woven fabric may be used in place of the non-woven fabric. However, a non-woven fabric allows the encapsulating material 109 to permeate more easily than a woven fabric but hardly allows air to remain. Therefore, a non-woven fabric does not substantially deteriorate the characteristics of the encapsulating material 109 and is thus more preferable than a woven fabric.

The shape and size of the insulating protect material 110 can be appropriately changed and may be arranged so as to cover at least either the bus bar lines 107 and 108 or the output lead lines 111 and 112 as long as the end portions of the non-woven fabric are positioned inside the end portions of the encapsulating material 109. Although explanation has been made in case where a woven fabric is used as the insulating protect material 110, any other electrically insulating material than a woven fabric may be used.

Persons in the art will easily derive other advantages and modifications. The broader concept of the present invention is not limited to a specific representative structure or examples shown in the drawings. Various modifications of the present invention will be achieved without deviating from the broad concept of the present invention defined in the appended claims and equivalents thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of encapsulating a photovoltaic module utilizing a lower chamber containing a table having a heater, and an upper chamber having a diaphragm elastically deformable under a pressure, the upper chamber and the lower chamber arranged to open and close relative to one another, the method designed to laminate a lamination unit having an encapsulating material and the photovoltaic module, the method comprising the steps of:

pre-heating the diaphragm to a predetermined temperature;

supplying the lamination unit onto the table; and pressing and heating the lamination unit by elastically deforming the diaphragm.

2. The method according to claim 1, further comprising the step of degassing the encapsulating material by closing the lower chamber and the upper chamber and depressurizing the lower chamber, after supplying the lamination unit onto the table.

3. The method according to claim 2, wherein the upper chamber is depressurized to a pressure substantially equal to that in the lower chamber at the same time when the lower chamber is depressurized.

4. The method according to claim 1, wherein the diaphragm is pre-heated after using the heater to heat the table by closing the lower chamber and the upper chamber and elastically deforming the diaphragm to make contact with the table after depressurizing the lower chamber.

5. The method according to claim 1, wherein the encapsulating material is previously subjected to a heat treatment to prevent the encapsulating material from contracting even when heated and pressed.

6. A method of encapsulating a photovoltaic module within a lamination unit that includes an encapsulation material, the method comprising the steps of:

subjecting the encapsulation material to a heat treatment to prevent the encapsulating material from contracting even when the lamination unit is subsequently pressed and heated;

pressing the lamination unit; and heating the lamination unit.

* * * * *